(12) United States Patent
Mei et al.

(10) Patent No.: US 10,135,401 B2
(45) Date of Patent: Nov. 20, 2018

(54) SWITCHING AMPLIFIER WITH ZERO VOLTAGE SWITCHING AND BALANCED THERMAL CONTROL ALGORITHM

(71) Applicant: General Electric Company, Schenectady, NY (US)

(72) Inventors: Ying Mei, ShangHai (CN); Pengcheng Zhu, ShangHai (CN); Juan Antonio Sabate, Niskayuna, NY (US); Song Chi, Niskayuna, NY (US); Ruxi Wang, Niskayuna, NY (US); Jianguo Xiao, ShangHai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 2 days.

(21) Appl. No.: 15/510,392

(22) PCT Filed: Sep. 10, 2015

(86) PCT No.: PCT/US2015/049378
§ 371 (c)(1),
(2) Date: Mar. 10, 2017

(87) PCT Pub. No.: WO2016/040596
PCT Pub. Date: Mar. 17, 2016

(65) Prior Publication Data
US 2017/0264248 A1    Sep. 14, 2017

(30) Foreign Application Priority Data
Sep. 12, 2014   (CN) .......................... 2014 1 0466064

(51) Int. Cl.
*H03F 3/217* (2006.01)
*H03F 1/26* (2006.01)
(Continued)

(52) U.S. Cl.
CPC ............ *H03F 1/26* (2013.01); *G01R 33/3852* (2013.01); *H03F 1/303* (2013.01); *H03F 3/2173* (2013.01); *H03F 3/2171* (2013.01)

(58) Field of Classification Search
CPC .......... H03F 3/217; H03F 1/52; H03F 3/2171; H03F 3/2173; H03F 2200/432;
(Continued)

(56) References Cited

U.S. PATENT DOCUMENTS

| | | | |
|---|---|---|---|
| 6,185,115 B1 * | 2/2001 | Sul ...................... | H02M 5/4585 363/37 |
| 6,750,633 B2 * | 6/2004 | Schreiber .................. | H02J 3/38 290/40 B |

(Continued)

FOREIGN PATENT DOCUMENTS

| CN | 1247319 A | 3/2000 |
|---|---|---|
| CN | 1745315 A | 3/2006 |

(Continued)

OTHER PUBLICATIONS

Chinese OA for patent application No. 201410466064.0, dated Sep. 30, 2017, 5 pages.

(Continued)

*Primary Examiner* — Khanh V Nguyen

(57) ABSTRACT

A switching amplifier includes a plurality of cascade elements, each bridge circuit includes an inductive load coupled between a first leg terminal of one of the at least two leg circuits and a second leg terminal of another one of the at least two leg circuits. A first leg voltage of the first leg terminal have a phase shift relative to a second leg voltage of the second leg terminal, the phase shift is used for causing the inductive load to store electric energy and generating a minimum circulating current−I min or I min sufficient to effect conducting of a corresponding diode; each of the switches is configured to be turned on if the corresponding (Continued)

diode conducts current to effect zero voltage switching of the corresponding switch. The minimum circulating current–I min or I min is equal to a constant value.

19 Claims, 7 Drawing Sheets

(51) Int. Cl.
  *H03F 1/30* (2006.01)
  *G01R 33/385* (2006.01)
(58) Field of Classification Search
  CPC ........ H03F 1/04; H03F 1/34; H03F 2200/351; H03F 2200/78; H03F 2200/33; H03F 1/00; H03F 3/36; H03F 3/44; H03F 1/3217; H03C 1/16
  USPC ........ 330/75, 146, 172, 207 A, 251
  See application file for complete search history.

(56) References Cited

U.S. PATENT DOCUMENTS

| | | | | |
|---|---|---|---|---|
| 6,845,020 | B2 * | 1/2005 | Deng | H02J 7/345 |
| | | | | 363/37 |
| 8,111,531 | B2 * | 2/2012 | Ilic | H02M 3/1584 |
| | | | | 363/132 |
| 8,497,734 | B2 * | 7/2013 | Stanley | H03F 1/0277 |
| | | | | 330/10 |
| 2004/0113689 | A1 | 6/2004 | Hajimiri et al. | |
| 2005/0017695 | A1 | 1/2005 | Stanley | |
| 2006/0152222 | A1 | 7/2006 | Trabbic et al. | |
| 2009/0128237 | A1 | 5/2009 | Attwood et al. | |

FOREIGN PATENT DOCUMENTS

| | | |
|---|---|---|
| CN | 103076580 A | 5/2013 |
| CN | 103078515 A | 5/2013 |
| EP | 1501177 A2 | 1/2005 |
| JP | 2012-244201 A | 12/2012 |

OTHER PUBLICATIONS

International Search Report and Written Opinion for International Application No. PCT/US2015/049378, dated Dec. 17, 2015, 9 pages.

* cited by examiner

SWITCHING AMPLIFIER WITH ZERO VOLTAGE SWITCHING AND BALANCED THERMAL CONTROL ALGORITHM

CROSS-REFERENCE TO RELATED APPLICATIONS

This is a national stage application under 35 U.S.C. § 371 (c) of PCT Patent Application No. PCT/US2015/049378, filed on Sep. 10, 2015, which claims priority to China Patent Application No. 201410466064.0, filed on Sep. 12, 2014, the disclosures of which are incorporated herein by reference in their entireties.

BACKGROUND

Embodiments of the disclosure relate generally to switching amplifiers, and more particularly to a gradient driver that is compatible with magnetic resonance imaging (MRI) systems.

In a MRI system, gradient drivers are configured to excite gradient coils located around an object, for example a patient, to generate magnetic field gradients along X-axes direction, Y-axes direction, and Z-axes direction. Typically, the gradient driver is a switching power supply which is composed of power semiconductor devices, such as insulated gate bipolar transistors (IGBTs), power metal oxide semiconductor field effect transistor (MOSFET), etc. In order to control an electrical power that can be transferred by the gradient driver, the power semiconductor devices are usually operated in a pulse width modulation (PWM) method.

However, the PWM method will lead to a fast voltage (dv/dt) or current (di/dt) transient which could generate a lot of high frequency harmonic contents. As mentioned above, the high frequency harmonic contents may contaminate radio frequency (RF) signals that will be sensed by RF coils, and lead to a significant degradation of the MR image quality. The high frequency harmonic contents could be defined as differential mode (DM) electromagnetic noise and common mode (CM) electromagnetic noise.

Therefore, it is desired to decrease the above electromagnetic noise generated by the gradient driver.

BRIEF DESCRIPTION

In accordance with one or more embodiments disclosed herein, a switching amplifier is provided. The switching amplifier includes a plurality n of cascade elements coupled in series between two terminals of a load. Each cascade element comprises two bridge circuits, each bridge circuit includes an inductive load and at least two leg circuits each comprised of switches, the inductive load is coupled between a first leg terminal of one of the at least two leg circuits and a second leg terminal of another one of the at least two leg circuits; each of the switches is electrically coupled in parallel with a diode. A first leg voltage of the first leg terminal have a phase shift relative to a second leg voltage of the second leg terminal; the phase shift is used for causing the inductive load to store electric energy and generate a minimum circulating current−I min or I min sufficient to effect conducting of a corresponding diode; each of the switches is configured to be turned on if the corresponding diode conducts current to effect zero voltage switching (ZVS) of the corresponding switch. The minimum circulating current−I min or I min is equal to a constant value.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In an effort to provide a concise description of these embodiments, not all features of an actual implementation are described in the one or more specific embodiments. It should be appreciated that in the development of any such actual implementation, as in any engineering or design project, numerous implementation-specific decisions must be made to achieve the developers' specific goals, such as compliance with system-related and business-related constraints, which may vary from one implementation to another.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either, any, several, or all of the listed items. The use of "including," "comprising," or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. The terms "circuit," "circuitry," and "controller" may include either a single component or a plurality of components, which are either active and/or passive components and may be optionally connected or otherwise coupled together to provide the described function.

Figure 1:
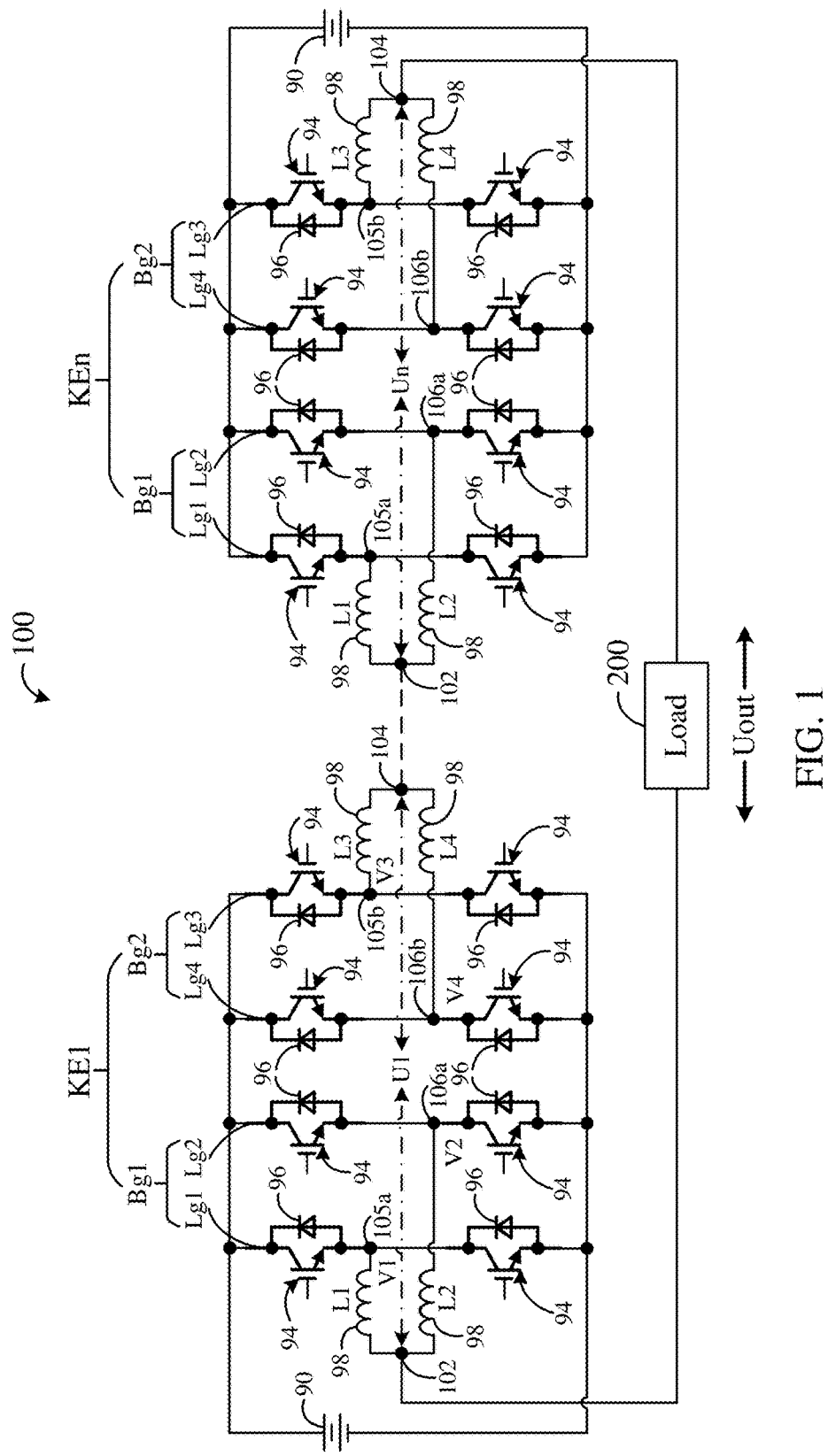
FIG. 1 is a circuit diagram illustrating a switching amplifier with n cascade elements in accordance with one embodiment of the present disclosure.

FIG. 1 is a circuit diagram illustrating a switching amplifier 100 in accordance with one embodiment of the present disclosure. The switching amplifier 100 is configured to power a load 200. As a non-limiting example, the switching amplifier 100 is a gradient amplifier of a magnetic resonance imaging (MRI) system, and the load 200 is a gradient coil of the MRI system.

The switching amplifier 100 includes a plurality n of cascade elements KE1, . . . KEn of the same type. In detail, the cascade elements KE1, . . . KEn are connected in series between two terminals of the load 200. Cascade element voltages U1, . . . Un are allocated to the respective cascade elements KE1, . . . KEn, their sum yields an output voltage Uout, across the load 200, of the switching amplifier 100; thus Uout=U1+ . . . Un.

Each of the cascade elements KE1, . . . KEn includes two bridge circuits Bg1, Bg2 connected to a power source 90. The bridge circuit Bg1 includes two leg circuits Lg1, Lg2 each comprised of two switches 94 connected in series between two poles of the power source 90, a first leg terminal 105a, and a second leg terminal 106a. The first leg terminal 105a is defined as a connection point between the two switches 94 of the leg circuit Lg1. The second leg terminal 106a is defined as a connection point between the two switches 94 of the leg circuit Lg2.

The bridge circuit Bg2 includes two leg circuits Lg3, Lg4 each comprised of two switches 94 connected in series between the two poles of the power source 90, a first leg terminal 105b, and a second leg terminal 106b. The first leg terminal 105b is defined as a connection point between the two switches 94 of the leg circuit Lg3. The second leg terminal 106b is defined as a connection point between the two switches 94 of the leg circuit Lg4. In other embodiments, each of the two bridge circuits Bg1, Bg2 may include three or more leg circuits.

The bridge circuit Bg1 further includes inductive loads 98 which, in the illustrated embodiment, include a first inductor L1 and a second inductor L2 connected in series between the first leg terminal 105a and the second leg terminal 106a. The bridge circuit Bg2 further includes inductive loads 98 which, in the illustrated embodiment, include a first inductor L3 and a second inductor L4 connected in series between the first leg terminal 105b and the second leg terminal 106b.

The connection point between the first inductor L1 and the second inductor L2 is defined as a first bridge terminal 102. The connection point between the first inductor L3 and the second inductor L4 is defined as a second bridge terminal 104. The first bridge terminal 102 and the second bridge terminal 104 provide the cascade element voltage. For example, the first bridge terminal 102 and the second bridge terminal 104 of the cascade element KE1 provide the cascade element voltage U1, the first bridge terminal 102 and the second bridge terminal 104 of the cascade element KEn provide the cascade element voltage Un.

As a non-limiting example, the switches 94 may be SiC metal-oxide-semiconductor field-effect transistors (MOSFETs). Again, as noted above, it is presently contemplated that some or all of the switches 94 may be IGBTs (Insulated Gate Bipolar Transistor), BJT (Bipolar Junction Transistor), thyristor, etc. SiC MOSFETs may be desirable to enable faster switching and a reduction in switching loss compared to other MOSFET materials, including Si.

Each switch 94 may include a diode 96 electrically coupled to the drain and the source of the SiC MOSFET. The diode 96 is electrically connected in parallel with the SiC MOSFET, such that a current is allowed to flow from a source of the SiC MOSFET and to a drain of the SiC MOSFET through the diode 96, rather than through the SiC MOSFET itself (e.g., the channel of the SiC MOSFET). This operation is substantially the same for all of the switches 94. The diodes 96 may enable current to flow between the drain and the source of the switches 94 to enable switching of the SiC MOSFET to an "on" state at zero voltage potential. Each SiC MOSFET may be considered to be in an "on" state when it is conducting and in an "off" state when it is not conducting.

During operation, in each of the cascade elements KE1, . . . KEn, a first leg voltage V1 of the first leg terminal 105a has a phase shift relative to a second leg voltage V2 of the second leg terminal 106a, and a first leg voltage V3 of the first leg terminal 105b has a phase shift relative to a second leg voltage V4 of the second leg terminal 106b. The phase shift is configured for causing the inductive load 98 to store electric energy and generate a minimum circulating current–I min or I min sufficient to effect conducting of the corresponding diode 96. Each of the switches 94 is configured to be turned on when the corresponding diode 96 conducts current to effect zero voltage switching of the corresponding switch 94. The minimum circulating current–I min or I min is equal to a constant value. Descriptions of the phase shift and the minimum circulating current–I min or I min will be discussed in further detail below with respect to FIGS. 2-7.

Figure 2:
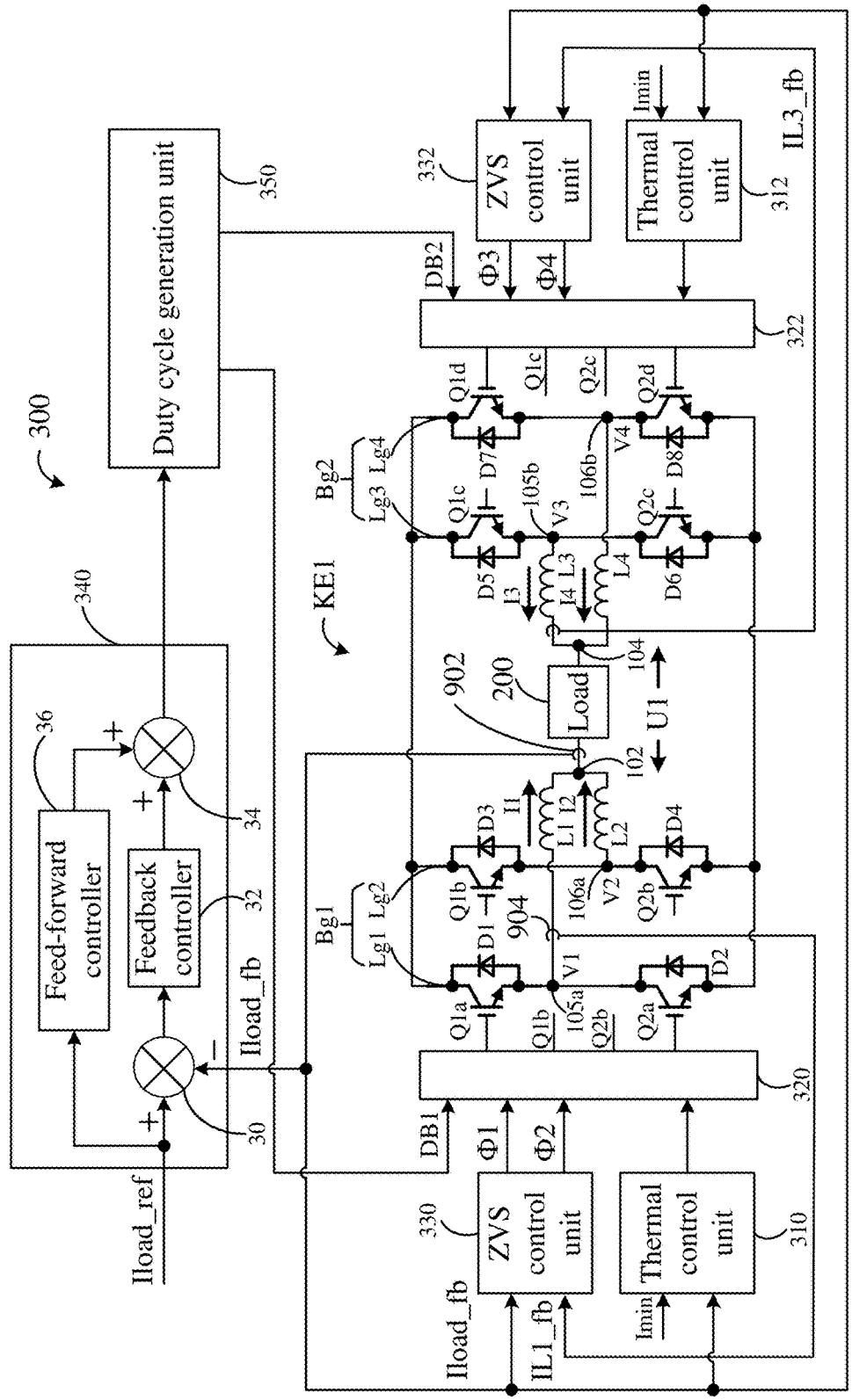
FIG. 2 is a simplified representation of FIG. 1 for the switching amplifier with one cascade elements.

FIG. 2 is a simplified representation of FIG. 1 for the switching amplifier 100 with one cascade element, for example, the cascade element KE1. As illustrated, the cascade element KE1 includes two bridge circuit Bg1, Bg2 comprised of eight switches 94. In other embodiments, the cascade element KE1 may include a fewer (e.g., four) or greater (e.g., twelve) number of switches.

The four switches 94 of the bridge circuit Bg1 are designated as a first switch Q1a, a second switch Q2a, a third switch Q1b, and a fourth switch Q2b. The four diodes 96 of the bridge circuit Bg1 are designated as a first diode D1, a second diode D2, a third diode D3, and a fourth diode D4.

The four switches 94 of the bridge circuit Bg2 are designated as a first switch Q1c, a second switch Q2c, a third switch Q1d, and a fourth switch Q2d respectively. The four diodes 96 of the bridge circuit Bg1 are designated as a first diode D5, a second diode D6, a third diode D7, and a fourth diode D8 respectively.

The first bridge terminal 102 and the second bridge terminal 104 are coupled to two respective terminals of the load 200. The first bridge terminal 102 and the second bridge terminal 104 provide the cascade element voltage U1 for powering the load 200.

Figure 3:
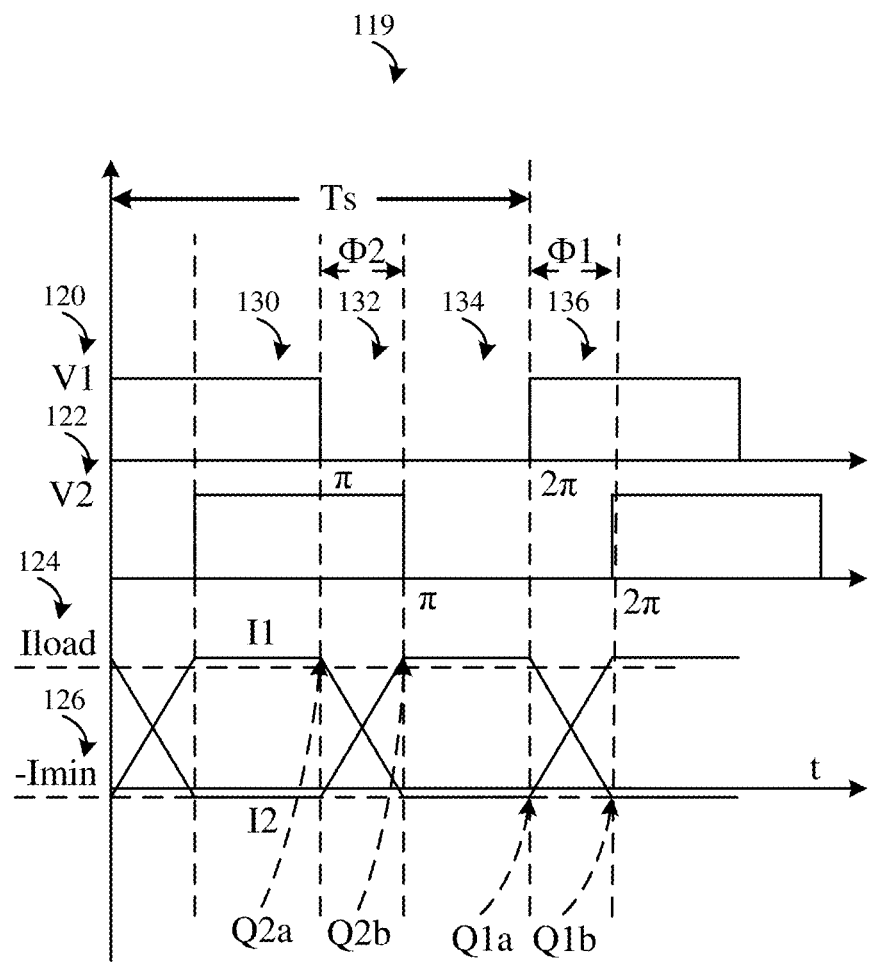
FIG. 3 is a series of voltage and current profiles showing voltages of two output terminals of the bridge circuit and currents flowing through the inductive load, in accordance with an aspect of the present disclosure.

FIG. 3 is a series of voltage and current profiles showing voltages on two output terminals of a bridge circuit and currents flowing through the first inductor L1 and the second inductor L2, in accordance with an aspect of the present disclosure.

In the plot 119, a voltage V1 profile 120 represents the first leg voltage V1 versus time, a voltage V2 profile 122 represents the second leg voltage V2 versus time. Current I1 profile 124 represents the current I1 flowing through the first inductor L1 versus time. Current I2 profile 126 represents the current I2 flowing through the second inductor L2 versus time. In the embodiment, the first leg voltage V1 and the second leg voltage V2 (e.g., the first and second leg voltages V1, V2 within the same bridge circuit) may both have the same duty cycle.

The first leg voltage V1 (represented by profile 120) and the second leg voltage V2 (represented by profile 122) may have a rising phase shift φ1 and a falling phase shift φ2 between them that facilitates zero-voltage switching of four switches Q1a, Q2a, Q1b, Q2b.

FIG. 3 demonstrates the condition when the current I load flowing through the load 200 is positive. When the current I load flowing through the load 200 is positive, the current I1 is flowed from the first leg terminal 105a to the first inductor L1, the current I2 is flowed from the second leg terminal 106a to the second inductor L2.

As depicted in FIG. 3, during a first time segment 130, the first leg voltage V1 is high, the second leg voltage V2 is high.

At the beginning of a second time segment 132, the first leg voltage V1 is changed from high to low, the second leg voltage V2 is high; the current I1 flowing through the first inductor L1 is equal to I min+I load, the first switch Q1a is changed from on to off, the second switch Q2a is changed from off to on; the current I1 flows through the second diode D2. The second switch Q2a is configured to be turned on when the second diode D2 conducts current, so as to effect zero voltage switching of the second switch Q2a.

At the end of the second time segment 132, the first leg voltage V1 is low, the second leg voltage V2 is changed from high to low; the current I2 flowing through the second inductor L2 is equal to I min+I load, the third switch Q1b is changed from on to off, the fourth switch Q2b is changed from off to on; the current I2 flows through the fourth diode D4. The fourth switch Q2b is configured to be turned on when the fourth diode D4 conducts current, so as to effect zero voltage switching of the fourth switch Q2b.

During a third time segment 134, the first leg voltage V1 is low, the second leg voltage V2 is low.

At the beginning of a fourth time segment 136, the first leg voltage V1 is changed from low to high, the second leg voltage V2 is low; the current I1 flowing through the first inductor L1 is equal to the minimum circulating current−I min, the first switch Q1a is changed from off to on, the second switch Q2a is changed from on to off; the current I1 flows through the first diode D1. The first switch Q1a is configured to be turned on when the first diode D1 conducts current, so as to effect zero voltage switching of the first switch Q1a.

At the end of the fourth time segment 136, the first leg voltage V1 is high, the second leg voltage V2 is changed from low to high; the current I2 flowing through the second inductor L2 is equal to the minimum circulating current−I min, the third switch Q1b is changed from off to on, the fourth switch Q2b is changed from on to off; the current I2 flows through the third diode D3. The third switch Q1b is configured to be turned on when the third diode D3 conducts current, so as to effect zero voltage switching of the third switch Q1b. This pattern of turning devices on and off may be repeated to generate the profiles depicted in FIG. 3 when the current I load flowing through the load 200 is positive.

The second time segment 132 is the duration of the falling phase shift φ2. The fourth time segment 136 is the duration of the rising phase shift φ1. During the second time segment 132 and the fourth time segment 136, two inductors L1, L2 stores electric energy.

The phase shifting method illustrated in FIG. 3 may be extended to the bridge circuit Bg2 in order to produce a periodic voltage signal across the first bridge terminal 102 and the second bridge terminal 104.

Similar to FIG. 3, in the condition when the current I load flowing through the load 200 is negative, if the current I1 flowing through the first inductor L1 is equal to the minimum circulating current I min, the current I2 flowing through the second inductor L2 is equal to I load−I min; if the current I2 flowing through the second inductor L2 is equal to the minimum circulating current I min, the current I1 flowing through the first inductor L1 is equal to I load−I min. When the current I load flowing through the load 200 is negative, the current I1 is flowed from the first inductor L1 to the first leg terminal 105a, the current I2 is flowed from the second inductor L2 to the second leg terminal 106a.

As shown in FIG. 3, the switching amplifier 100 of FIG. 2 is operated in a desired mode. In the desired mode, the current I1 flowing through the first inductor L1 and the current I2 flowing through the second inductor L2 have the same minimum circulating current−I min (if I load >0) or I min (if I load <0) sufficient to cause conducting of the corresponding diode and achieve ZVS. As a non-limiting example, I min=50 A.

Figure 4:
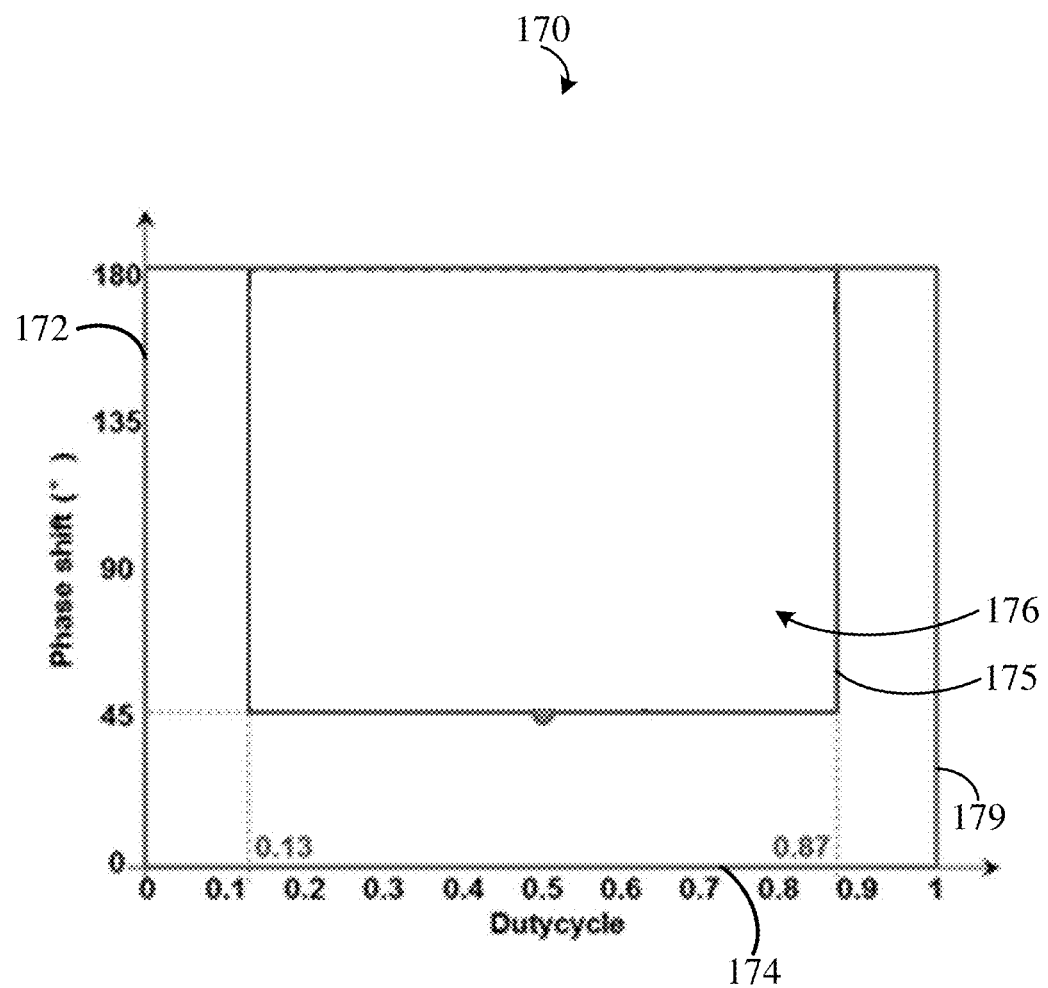
FIG. 4 is a graph visually depicting a region of duty cycles and phase shifts for which zero voltage switching is possible in the switches of a switching amplifier, in accordance with an aspect of the present disclosure.

FIG. 4 is a plot 170 depicting a region of duty cycles and phase shifts suitable for achieving zero-voltage switching in the switches 94 described herein. As a non-limiting example, the system parameters for FIG. 4 are Vdc=2100V, switching frequency=62.5 kHz, L1=L2=3.5 uH, I load=600 A and I min=0 A. Indeed, it should be noted that the phase shift angle and duty cycle may be managed or controlled in order to achieve zero voltage switching.

In particular, the plot 170 depicts phase shift angle 172 as a function of duty cycle 174. The duty cycle 174 represents the value of the duty cycle for the first leg voltage V1 of the first leg terminal 105a and the second leg voltage V2 of the second leg terminal 106a. In certain embodiments, the duty cycles for the first leg voltage V3 of the first leg terminal 105b and the second leg voltage V4 of the second leg terminal 106b may be complementary to the first leg voltage V1 and the second leg voltage V2. For example, if the duty cycle of the first leg voltage V1 and the second leg voltage V2 is 87%, then the duty cycle of the first leg voltage V3 and the second leg voltage V4 is 13%. Thus, the plot 170 may be suitable for embodiments where the first leg voltage V3 and the second leg voltage V4 are complementary to the first leg voltage V1 and the second leg voltage V2.

The phase shift angle 172 represented in the plot 170 is the phase shift angle between the combination of the first leg voltage V1 and the second leg voltage V2, and the combination of the first leg voltage V3 and the second leg voltage V4.

For the case that the switching amplifier 100 of FIG. 2 is operated in the desired mode, a graph area 176 represents the range of duty cycles and phase shift angles where zero-voltage switching can be achieved. The solid line 175 indicates the boundary on the graph area 176.

Consider the area of whole operation range to be 1 (indicated by the solid line 179), the graph area 176 is 55% of the total area. The desired mode can achieve the minimum circulating current−I min or I min sufficient to achieve ZVS. In the condition when I load >0, if I1=Imin, I2=I min+I load; if I2=−Imin, I1=I min+I load. In the condition when I load <0, if I1=I min, I2=I load−I min; if I2=I min, I1=I load−I min. Therefore, because of the minimum circulating current−I min or I min, the rated current of each switch 94 can be small, and energy consumption of each switch 94 can be reduced.

Dual Phase Shift Regulation

Based on a desired mode, only one phase-shift angle in the leg circuit Lg1 and the leg circuit Lg2 of the bridge circuit Bg1 are present. The phase shift at pulse width modulation (PWM) rising edge is equal to the phase shift at PWM falling edge. This works when the load current I load flowing through the load 200 keeps constant and current ripple on the first inductor L1 and the second inductor L2 is negligible. To handle variation of the current I load and large current ripple on the first inductor L1 and the second inductor L2 (meaning that the current flowing through either of the first inductor L1 or the second inductor L2 is greater than or smaller than a predetermined current) and guarantee the switches Q1a, Q2a, Q1b, Q2b are turned on via ZVS even during dynamical operation, dual phase shift regulation (φ1 and φ2) algorithms are performed by a ZVS control unit 330, shown in FIG. 2, of the control device 300.

Phase shift φ1 is defined as the phase shift between the first leg voltage V1 and the second leg voltage V2 at their rising edge. The phase shift φ1 will lead to positive voltage drop on the first inductor L1, the current I1 will be regulated from its negative flattop value (IL1_N_fb) to the desired positive flattop value (IL1_P*), which will guarantee the first switch Q1a and the third switch Q1b are turned on via ZVS. The rising phase shift φ1 is calculated by the ZVS control unit 330 according to equation 1.

$$\varphi_1 = T_{rise}/T_S = (I_{L1\_P}* - I_{L1\_N\_fb})/M_1 T_S \quad \text{Equation 1}$$

Phase shift φ2 is defined as the phase shift between the first leg voltage V1 and the second leg voltage V2 at their falling edge. The phase shift φ2 will lead to negative voltage drop on the first inductor L1, the current I1 will be regulated from its positive flattop value (IL1_P_fb) to the desired negative flattop value (IL1_N*), which will guarantee the second switch Q2a and the fourth switch Q2b are turned on via ZVS. The falling phase shift Φ2 is calculated by the ZVS control unit 330 according to equation 2.

$$\varphi_2 = T_{fall}/T_S = (I_{L1\_P\_fb} - I_{L1\_N}*)/M_1 T_S \quad \text{Equation 2}$$

Where $M_1 = Vdc/(L_1 + L_2)$, Vdc is a voltage of the power source 90, T rise is a rising predetermined period of time, T fall is a falling predetermined period of time. As shown in FIG. 3, Ts is the switching period of the switching amplifier 900. When the current I load is positive, IL1_N*=−I min, IL1_P*=I load_fb+I min. I load_fb is a current flowing through the load 200, and may be measured by a current sensor 902. The rising predetermined period of time is the duration of the rising phase shift. The falling predetermined period of time is the duration of the falling phase shift.

Figure 5:
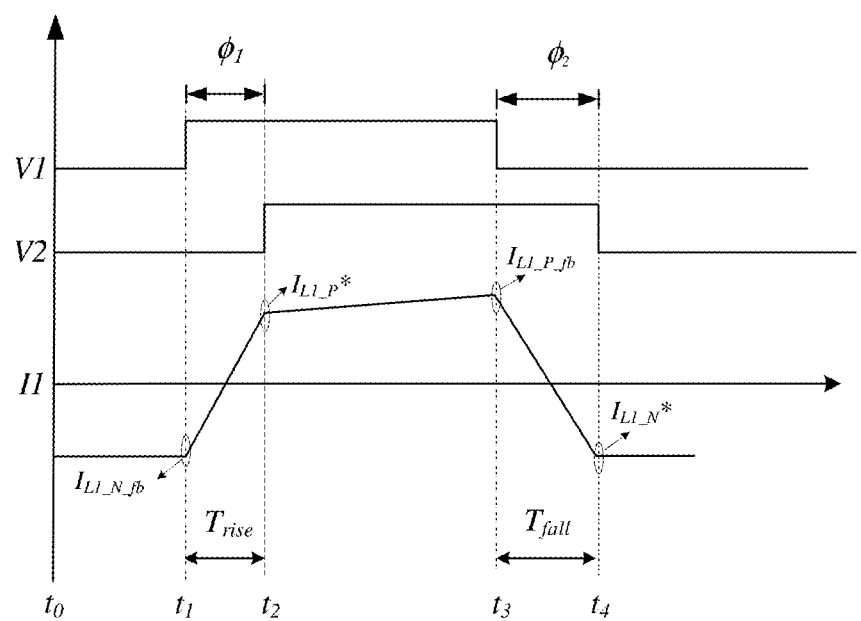
FIG. 5 is a voltage and current profiles showing voltages of two output terminals of the bridge circuit and a current flowing through the first inductor when dual phase shift regulations are performed by the switching amplifier.

As shown in FIG. 5, $I_{L1\_N\_fb}$ is a current flowing through the first inductor L1 when the first leg voltage V1 is change from low to high, $I_{L1\_p\_fb}$ is a current flowing through the first inductor L1 when the first leg voltage V1 is change from high to low. As a non-limiting example, $I_{L1\_N\_fb}$ and $I_{L1\_p\_fb}$ are measured by a current sensor 904.

The dual phase shift regulation method illustrated in FIG. 5 may be extended to the leg circuit Lg3 and the leg circuit Lg4 of the bridge circuit Bg2.

Decouple ZVS Control and Load Current Control

The control device 300, shown in FIG. 2, is configured for generating a first desired duty cycle DB1 and a second desired duty cycle DB2 allocated to two respective bridge circuits Bg1, Bg2.

Taking the bridge circuit Bg1 for example, the desired duty cycle of a first bridge voltage Vpole-B1 of the first bridge terminal 102 is DB1, in order to avoid any interference to the current flowing through the load 200, the first bridge voltage Vpole-B1 should always keep its equivalent duty cycle at DB1, even when two different phase shifts φ1, φ2 are implemented on the bridge circuit Bg1.

Figure 6:
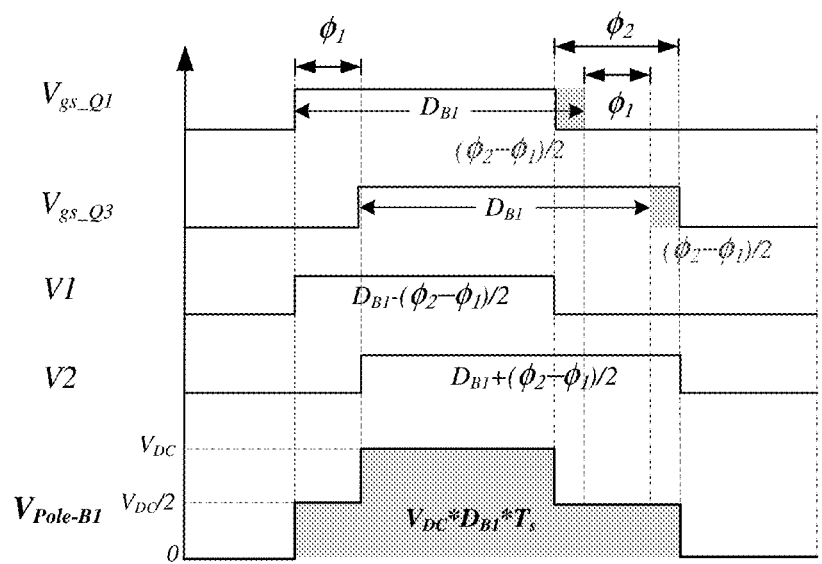
FIG. 6 is a voltage profile showing voltages of two output terminals of the bridge circuit when ZVS control is decoupled from load current control.

A special method to allocate two different phase shifts φ1 and φ2 is described. As shown in FIG. 6, the difference of the rising phase shift φ1 and the falling phase shift φ2 is φ2−φ1. In order to ensure that the equivalent duty cycle of the first bridge voltage Vpole-B1 is DB1, the driver circuit 320 is configured by the control device 300 to control four switches Q1a, Q2a, Q1b, Q2b, such that the duty cycle of the first leg voltage V1 is equal to DB1−(φ2−φ1)/2, and the duty cycle of the second leg voltage V2 is equal to DB1+(φ2−φ1)/2. As a non-limiting example, the driver circuit 320 includes four drivers coupled to four respective switches Q1a, Q2a, Q1b, Q2b.

As a result, the first bridge voltage Vpole-B1 will be a 3-level voltage waveform, and the shadow area of the first bridge voltage Vpole-B1 is VDC*DB1*TS. The equivalent duty cycle of the first bridge voltage Vpole-B1 is equal to DB1. In another word, the ZVS control will not interfere with load current control.

The method for allocating two phase shifts φ1, φ2, as illustrated in FIG. 6, may be extended to the leg circuit Lg3 and the leg circuit Lg4 of the bridge circuit Bg2.

In detail, the control device 300 further includes a load current control unit 340 and a duty cycle generation unit 350. The load current control unit 340 includes a subtractor 30, a feedback controller 32, an adder 34, and a feed-forward controller 36.

The subtractor 30 is used for processing a current reference I load_ref and the current I load_fb flowing through the load 200 in order to generate a difference between the current reference I load_ref and the current I load_fb. The difference is regarded as a current error. The feedback controller 32 is used for generating a feedback command according to the difference. As a non-limiting example, the feedback controller 32 may be an integrator for accumulating the current error, a proportional amplifier, or other controllers.

The feed-forward controller 36 is used for generating a feed-forward command according to the current reference I load_ref. As a non-limiting example, the feed-forward controller 36 may be a proportional amplifier, or other controllers.

The adder 34 is used to generate a sum of the feedback command and the feed-forward command. The duty cycle generation unit 350 is used for generating the first desired duty cycle DB1 and the second desired duty cycle DB2 according to the sum of the feedback command and the feed-forward command, where $$DB1 = \frac{Vload}{2Vdc} + 0.5,$$

DB2=1−DB1; V load is the voltage across the load 200.

Balanced Thermal Control Algorithm

Based on the above description, the phase shift angle Φ is positive which means the leg circuit Lg1 is always leading and the leg circuit Lg2 is always lagging, therefore heat generated by the leg circuit Lg1 and heat generated by the leg circuit Lg2 are not balanced. In order to achieve balanced thermal performance, a balanced thermal control algorithm is performed by the control device 300 of FIG. 2.

The balanced thermal control algorithm is defined as:

If Φ>0, the leg circuit Lg1 is leading and the leg circuit Lg2 is lagging; that is, the first leg voltage V1 has a positive phase shift relative to the second leg voltage V2.

If Φ<0, the leg circuit Lg1 is lagging and the leg circuit Lg2 is leading; that is, the first leg voltage V1 has a negative phase shift relative to the second leg voltage V2, therefore the heat generated by the leg circuit Lg1 and the heat generated by the leg circuit Lg2 are balanced.

In detail, the control device 300 is configured to control a driver circuit 320 comprised of four drivers (not shown) that are coupled to four respective switches Q1a, Q2a, Q1b, Q2b, such that the first leg voltage V1 has the positive phase shift relative to the second leg voltage V2 during a first period 150, the first leg voltage V1 has the negative phase shift relative to the second leg voltage V2 during a second period 154.

The control device 300 further includes a thermal control unit 310 for performing the above balanced thermal control algorithm, so as to achieve balanced thermal performance. The thermal balance control unit 310 is configured to control the driver circuit 320, such that a first pulse signal and a second pulse signal are respectively applied to the first leg terminal 105a and the second leg terminal 106a during a transient period 152 between the first period 150 and the second period 154 if a current I load_fb flowing through the load 200 is equal to zero.

When the transition is happened from Φ>0 to Φ<0, the first pulse signal is "101", the second pulse signal is high during the transient period 152. Similar to FIG. 7, when the transition is happened from Φ<0 to Φ>0; that is, the first leg voltage V1 has the negative phase shift relative to the second leg voltage V2 during the first period 150 and the first leg voltage V1 has the positive phase shift relative to the second leg voltage V2 during the second period 154; the first pulse signal is high during the transient period 152, the second pulse signal is "101".

The balanced thermal control algorithm described above may be extended to the leg circuit Lg3 and the leg circuit Lg4 of the bridge circuit Bg2.

As further described herein, the control device 300 is further configured to control the driver circuit 320 of the bridge circuit Bg1 and the driver circuit 322 of the bridge circuit Bg2, such that the current I load flowing though the load 200 is equal to zero during the first period 150, the transient period 152, and the second period 154. As a non-limiting example, the driver circuit 322 includes four drivers (not shown) that are coupled to four respective switches Q1c, Q2c, Q1d, Q2d.

Figure 7:
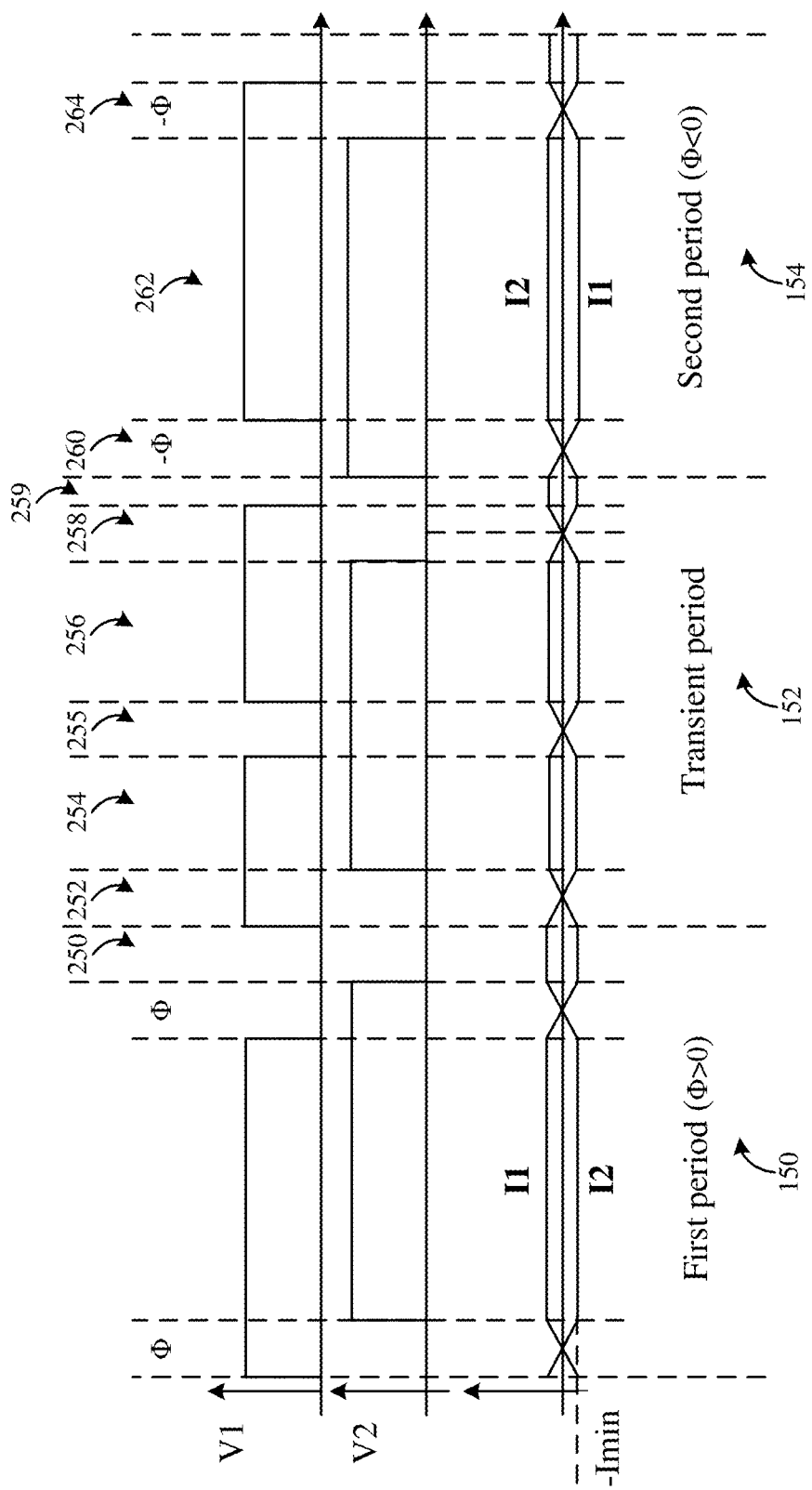
FIG. 7 is a voltage and current profiles showing voltages of two output terminals of the bridge circuit and currents flowing through the inductive load when balanced thermal control algorithms are performed by the switching amplifier.

Similar to FIG. 3, in FIG. 7, during a time segment 250 of the first period 150, the first leg voltage V1 is low, the second leg voltage V2 is low.

At the beginning of a first time segment 252 of the transient period 152, the first leg voltage V1 is changed from low to high, the second leg voltage V2 is low; the current I1 flowing through the first inductor L1 is equal to −I min, the first switch Q1a is changed from off to on, the second switch Q2a is changed from on to off; the current I1 flows through the first diode D1. The first switch Q1a is configured to be turned on when the first diode D1 conducts current, therefore the first switch Q1a is turned on via ZVS.

At the end of the first time segment 252, the first leg voltage V1 is high, the second leg voltage V2 is changed from low to high; the current I2 flowing through the second inductor L2 is equal to −I min, the third switch Q1b is changed from off to on, the fourth switch Q2b is changed from on to off; the current I2 flows through the third diode D3. The third switch Q1b is configured to be turned on when the third diode D3 conducts current, therefore the third switch Q1b is turned on via ZVS.

During a second time segment 254 of the transient period 152, the first leg voltage V1 is high, the second leg voltage V2 is high.

At the beginning of a third time segment 255 of the transient period 152, the first leg voltage V1 is changed from high to low, the second leg voltage V2 is high; the current I1 flowing through the first inductor L1 is equal to I min+I load, the first switch Q1a is changed from on to off, the second switch Q2a is changed from off to on; the current I1 flows through the second diode D2. The second switch Q2a is configured to be turned on when the second diode D2 conducts current, therefore the second switch Q2a is turned on via ZVS.

At the end of the third time segment 255, the first leg voltage V1 is changed from low to high, the second leg voltage V2 is high; the current I1 flowing through the first inductor L1 is equal to −I min, the first switch Q1a is changed from off to on, the second switch Q2a is changed from on to off; the current I1 flows through the first diode D1. The first switch Q1a is configured to be turned on when the first diode D1 conducts current, therefore the first switch Q1a is turned on via ZVS.

The width of the third time segment 255 is equal to ΔD. Where, ΔD=2I min/M1, M1=Vdc/(L1+L2).

During a fourth time segment 256 of the transient period 152, the first leg voltage V1 is high, the second leg voltage V2 is high.

At the beginning of a fifth time segment 258 of the transient period 152, the first leg voltage V1 is high, the second leg voltage V2 is changed from high to low; the current I2 flowing through the second inductor L2 is equal to I min+I load, the third switch Q1b is changed from on to off, the fourth switch Q2b is changed from off to on; the current I2 flows through the fourth diode D4. The fourth switch Q2b is configured to be turned on when the fourth diode D4 conducts current, therefore the fourth switch Q2b is turned on via ZVS.

At the end of the fifth time segment 258, the first leg voltage V1 is changed from high to low, the second leg voltage V2 is low; the current I1 flowing through the first inductor L1 is equal to I min+I load, the first switch Q1a is changed from on to off, the second switch Q2a is changed from off to on; the current I1 flows through the second diode D2. The second switch Q2a is configured to be turned on when the second diode D2 conducts current, therefore the second switch Q2a is turned on via ZVS.

During a sixth time segment 259 of the transient period 152, the first leg voltage V1 is low, the second leg voltage V2 is low.

At the beginning of a first time segment 260 of the second period 154, the first leg voltage V1 is low, the second leg voltage V2 is changed from low to high; the current I2 flowing through the second inductor L2 is equal to −I min, the third switch Q1b is changed from off to on, the fourth switch Q2b is changed from on to off; the current I2 flows through the third diode D3. The third switch Q1b is configured to be turned on when the third diode D3 conducts current, therefore the third switch Q1b is turned on via ZVS.

At the end of the first time segment 260 of the second period 154, the first leg voltage V1 is changed from low to high, the second leg voltage V2 is high; the current I1 flowing through the first inductor L1 is equal to −I min, the first switch Q1a is changed from off to on, the second switch Q2a is changed from on to off; the current I1 flows through the first diode D1. The first switch Q1a is configured to be turned on when the first diode D1 conducts current, therefore the first switch Q1a is turned on via ZVS.

During a second time segment 262 of the second period 154, the first leg voltage V1 is high, the second leg voltage V2 is high.

At the beginning of a third time segment 264 of the second period 154, the first leg voltage V1 is high, the second leg voltage V2 is changed from high to low; the current I2 flowing through the second inductor L2 is equal to I min+I load, the third switch Q1b is changed from on to off, the fourth switch Q2b is changed from off to on; the current I2 flows through the fourth diode D4. The fourth switch Q2b is configured to be turned on when the fourth diode D4 conducts current, therefore the fourth switch Q2b is turned on via ZVS.

At the end of the third time segment 264, the first leg voltage V1 is changed from high to low, the second leg voltage V2 is low; the current I1 flowing through the first inductor L1 is equal to I min+I load, the first switch Q1a is changed from on to off, the second switch Q2a is changed from off to on; the current I1 flows through the second diode D2. The second switch Q2a is configured to be turned on when the second diode D2 conducts current, therefore the second switch Q2a is turned on via ZVS.

Therefore, during the transient period 152, the first switch Q1a, the second switch Q2a, the third switch Q1b, and the fourth switch Q2b are both turned on via ZVS.

Compared to the hard switching of the switches 94, due to the soft switching of the switches 94, the switching loss and the electromagnetic noise generated by the switching amplifier 100 are effectively reduced.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A switching amplifier, comprising:
   a plurality of cascade elements coupled in series between two terminals of a load;
   wherein each cascade element comprises two bridge circuits, each bridge circuit includes an inductive load and at least two leg circuits each comprised of switches, the inductive load is coupled between a first leg terminal of one of the at least two leg circuits and a second leg terminal of another one of the at least two leg circuits, each of the switches is electrically coupled in parallel with a diode;
   wherein a first leg voltage of the first leg terminal have a phase shift relative to a second leg voltage of the second leg terminal, the phase shift is used for causing the inductive load to store electric energy and generate a minimum circulating current (I min) sufficient to effect conducting of a corresponding diode, each of the switches is configured to be turned on if the corresponding diode conducts current to effect zero voltage switching (ZVS) of the corresponding switch; and
   wherein the minimum circulating current (I min) is equal to a constant value.

2. The switching amplifier of claim 1, wherein the phase shift comprises a rising phase shift and a falling phase shift, the inductive load comprises a first inductor and a second inductor connected in series between the first and second leg terminals, each bridge circuit comprises four switches defined as a first switch, a second switch, a third switch, and a fourth switch respectively.

3. The switching amplifier of claim 2, wherein a duty cycle of a bridge voltage of a connection point between the first and second inductors is not related to the rising and falling phase shifts.

4. The switching amplifier of claim 3, wherein a duty cycle of the first leg voltage is equal to $DB1-\Delta\emptyset$, a duty cycle of the second leg voltage is equal to $DB1+\Delta\emptyset$, $\Delta\emptyset=(\emptyset2-\emptyset1)/2$, where $\emptyset1$ is the rising phase shift and $\emptyset2$ is the falling phase shift.

5. The switching amplifier of claim 2, where the rising phase shift and the falling phase shift are adjusted to ensure zero voltage switching of the four switches of each bridge circuit if a current flowing through the load is varied or a current flowing through either of the first inductor or the second inductor is greater than or smaller than a predetermined current.

6. The switching amplifier of claim 2, further comprising a control device, wherein, the control device is configured to control the switching amplifier, such that the first leg voltage has a positive phase shift relative to the second leg voltage during a first period, the first leg voltage has a negative phase shift relative to the second leg voltage during a second period, and a first pulse signal and a second pulse signal are respectively applied to the first leg terminal and the second leg terminal during a transient period between the first period and the second period if a current flowing through the load is equal to zero.

7. The switching amplifier of claim 6, wherein the first pulse signal goes from high to low to high, the second pulse signal is high during the transient period.

8. The switching amplifier of claim 2, wherein the rising and falling phase shifts are positive;
   at the beginning of a first time segment, a current flowing through the first inductor is equal to I min+I load, such that the second switch is turned on via ZVS, at the end of the first time segment, a current flowing through the second inductor is equal to I min+I load, such that the fourth switch is turned on via ZVS; and
   at the beginning of a second time segment, the current flowing through the first inductor is equal to the minimum circulating current (I min), such that the first switch is turned on via ZVS, at the end of the second time segment, the current flowing through the second inductor is equal to the minimum circulating current (I min), such that the third switch is turned on via ZVS;
   wherein the first time segment is the duration of the falling phase shift, the second time segment is the duration of the rising phase shift.

9. The switching amplifier of claim 2, wherein the rising and falling phase shifts are negative;
   at the beginning of a first time segment, a current flowing through the second inductor is equal to the minimum circulating current (I min), such that the third switch is turned on via ZVS, at the end of the first time segment, a current flowing through the first inductor is equal to the minimum circulating current (I min), such that the first switch is turned on via ZVS; and
   at the beginning of a second time segment, the current flowing through the second inductor is equal to I min+I load, such that the fourth switch is turned on via ZVS, at the end of the second time segment, the current flowing through the first inductor is equal to I min+I load, such that the second switch is turned on via ZVS;
   wherein the first time segment is the duration of the rising phase shift, the second time segment is the duration of the falling phase shift.

10. A method of operating a switching amplifier, the switching amplifier comprising a plurality of cascade elements, each cascade element comprising two bridge circuits, the method comprising:
- coupling the cascade elements in series between two terminals of a load;
- providing an inductive load and at least two leg circuits each comprised of switches in each bridge circuit;
- coupling the inductive load between a first leg terminal of one of the at least two leg circuits and a second leg terminal of another one of the at least two leg circuits;
- coupling each of the switches in parallel with a diode;
- configuring a first leg voltage of the first leg terminal that has a phase shift relative to a second leg voltage of the second leg terminal, the phase shift being used for causing the inductive load to store electric energy and generate a minimum circulating current (I min) sufficient to effect conducting of a corresponding diode; and
- turning on each of the switches if the corresponding diode conducts current to effect zero voltage switching (ZVS) of the corresponding switch;
- wherein the minimum circulating current (I min) is equal to a constant value.

11. The method of claim 10, wherein the phase shift comprises a rising phase shift and a falling phase shift, the inductive load comprises a first inductor and a second inductor connected in series between the first and second leg terminals, each bridge circuit comprises four switches defined as a first switch, a second switch, a third switch, and a fourth switch respectively.

12. The method of claim 11, wherein a duty cycle of a bridge voltage of a connection point between the first and second inductors is not related to the rising and falling phase shifts.

13. The method of claim 11, wherein a duty cycle of the first leg voltage is equal to $DB1-\Delta\varnothing$, a duty cycle of the second leg voltage is equal to $DB1+\Delta\varnothing$, $\Delta\varnothing=(\varnothing2-\varnothing1)/2$, where $\varnothing1$ is the rising phase shift and $\varnothing2$ is the falling phase shift.

14. The method of claim 11, further comprising adjusting the rising phase shift and the falling phase shift to ensure zero voltage switching of the four switches of each bridge circuit if a current flowing through the load is varied or a current flowing through either of the first inductor or the second inductor is greater than or smaller than a predetermined current.

15. The method of claim 11, wherein the method comprising:
- controlling the first leg voltage to have a positive phase shift relative to the second leg voltage during a first period;
- controlling the first leg voltage to have a negative phase shift relative to the second leg voltage during a second period;
- controlling a first pulse signal and a second pulse signal to be respectively applied to the first leg terminal and the second leg terminal during a transient period between the first period and the second period if a current flowing through the load is equal to zero.

16. The method of claim 15, wherein the first pulse signal goes from high to low to high, the second pulse signal is high during the transient period.

17. The method of claim 11, wherein the rising and falling phase shifts are positive, the method further comprises:
- at the beginning of a first time segment, controlling a current flowing through the first inductor to be equal to I min+I load, such that the second switch is turned on via ZVS;
- at the end of the first time segment, controlling a current flowing through the second inductor to be equal to I min+I load, such that the fourth switch is turned on via ZVS;
- at the beginning of a second time segment, controlling the current flowing through the first inductor to be equal to the minimum circulating current (I min), such that the first switch is turned on via ZVS; and
- at the end of the second time segment, controlling the current flowing through the second inductor to be equal to the minimum circulating current (I min), such that the third switch is turned on via ZVS;
- wherein the first time segment is the duration of the falling phase shift, the second time segment is the duration of the rising phase shift.

18. The method of claim 11, wherein the rising and falling phase shifts are negative, the method further comprises:
- at the beginning of a first time segment, controlling a current flowing through the second inductor to be equal to the minimum circulating current (I min), such that the third switch is turned on via ZVS;
- at the end of the first time segment, controlling a current flowing through the first inductor to be equal to the minimum circulating current (I min), such that the first switch is turned on via ZVS;
- at the beginning of a second time segment, controlling the current flowing through the second inductor to be equal to I min+I load, such that the fourth switch is turned on via ZVS; and
- at the end of the second time segment, controlling the current flowing through the first inductor to be equal to I min+I load, such that the second switch is turned on via ZVS;
- wherein the first time segment is the duration of the rising phase shift, the second time segment is the duration of the falling phase shift.

19. A gradient amplifier, comprising:
- a plurality of cascade elements coupled in series between two terminals of a gradient coil; wherein each cascade element comprises two bridge circuit, each bridge circuit includes an inductive load and at least two leg circuits each comprised of switches, the inductive load is coupled between a first leg terminal of one of the at least two leg circuits and a second leg terminal of another one of the at least two leg circuits, each of the switches is electrically coupled in parallel with a diode;
- wherein a first leg voltage of the first leg terminal have a phase shift relative to a second leg voltage of the second leg terminal, the phase shift is used for causing the inductive load to store electric energy and generate a minimum circulating current (I min) sufficient to effect conducting of a corresponding diode, each of the switches is configured to be turned on if the corresponding diode conducts current to effect zero voltage switching (ZVS) of the corresponding switch; and
- wherein the minimum circulating current (I min) is equal to a constant value.

* * * * *